United States Patent [19]

Cornish

[11] Patent Number: 4,754,165
[45] Date of Patent: Jun. 28, 1988

[54] STATIC MOS SUPER BUFFER LATCH

[75] Inventor: Eldon C. Cornish, Colorado Springs, Colo.

[73] Assignee: Hewlett-Packard Company, Palo Alto, Calif.

[21] Appl. No.: 891,499

[22] Filed: Jul. 29, 1986

[51] Int. Cl.[4] .................. H03K 3/26; H03K 17/16; H03K 19/017; H03K 3/29
[52] U.S. Cl. .................................. 307/279; 307/443; 307/448; 307/450; 307/291
[58] Field of Search ................ 307/200 B, 443, 450, 307/453, 448, 279, 288, 291

[56] References Cited
PUBLICATIONS

IBM Tech. Disc., Dailey et al., vol. 13, No. 8, Jan. 1971.

Primary Examiner—John S. Heyman
Assistant Examiner—M. R. Wambach
Attorney, Agent, or Firm—Edward L. Miller

[57] ABSTRACT

A low-power high-speed static latch with super buffer outputs is implemented as an MOS integrated circuit by providing resistive cross coupling from those super buffer outputs to inputs through depletion devices that serve in the place of high valued resistors. The resulting static latch exhibits only one gate delay from input to output, has only one enhancement device at a time on, and may be used to create a static MOS shift register.

3 Claims, 2 Drawing Sheets

STATIC MOS SUPER BUFFER LATCH

BACKGROUND AND SUMMARY OF THE INVENTION

It would be desirable if the cross-coupling of output stages could create a high performance static latch in integrated MOS circuits as it does in discrete circuits. More particularly, if would be desirable if there were a static latch circuit configuration for super buffer output stages that provided fast rise times, a minimum of gate delay from input to output, an ability to drive heavy loads, and low internal power dissipation. A resistor would be the natural choice for a feedback element to use as coupling from the output of one stage to the input of the other. Risetime and power dissipation considerations favor a design wherein such resistive feedback is of a high ohmic value. Unfortunately, when rendered as MOS devices in an integrated circuit (IC), actual resistors in the tens or hundreds of kilo-ohm range are hundreds of times larger than MOS transistors. As a consequence, it is common for a high performance latch in an MOS IC to be a dynamic latch only, requiring that the output be periodically clocked back into the input to refresh the state of the latch.

According to the invention a depletion device is used to provide high-valued resistive feedback to form a high performance static super buffer latch in an MOS IC. Since the output stages are of the super buffer configuration, with the depletion loads driven by complementary inputs, the latch affords good speed and output power. As will be described, for either state of the latch only one load is on at any one time, so internal power dissipation is kept to a minimum. The invention is applicable to both N-channel and P-channel processes. The resulting latch can also be used as a stage in a static shift-register.

DESCRIPTION OF A PREFERRED EMBODIMENT

Figure 1:
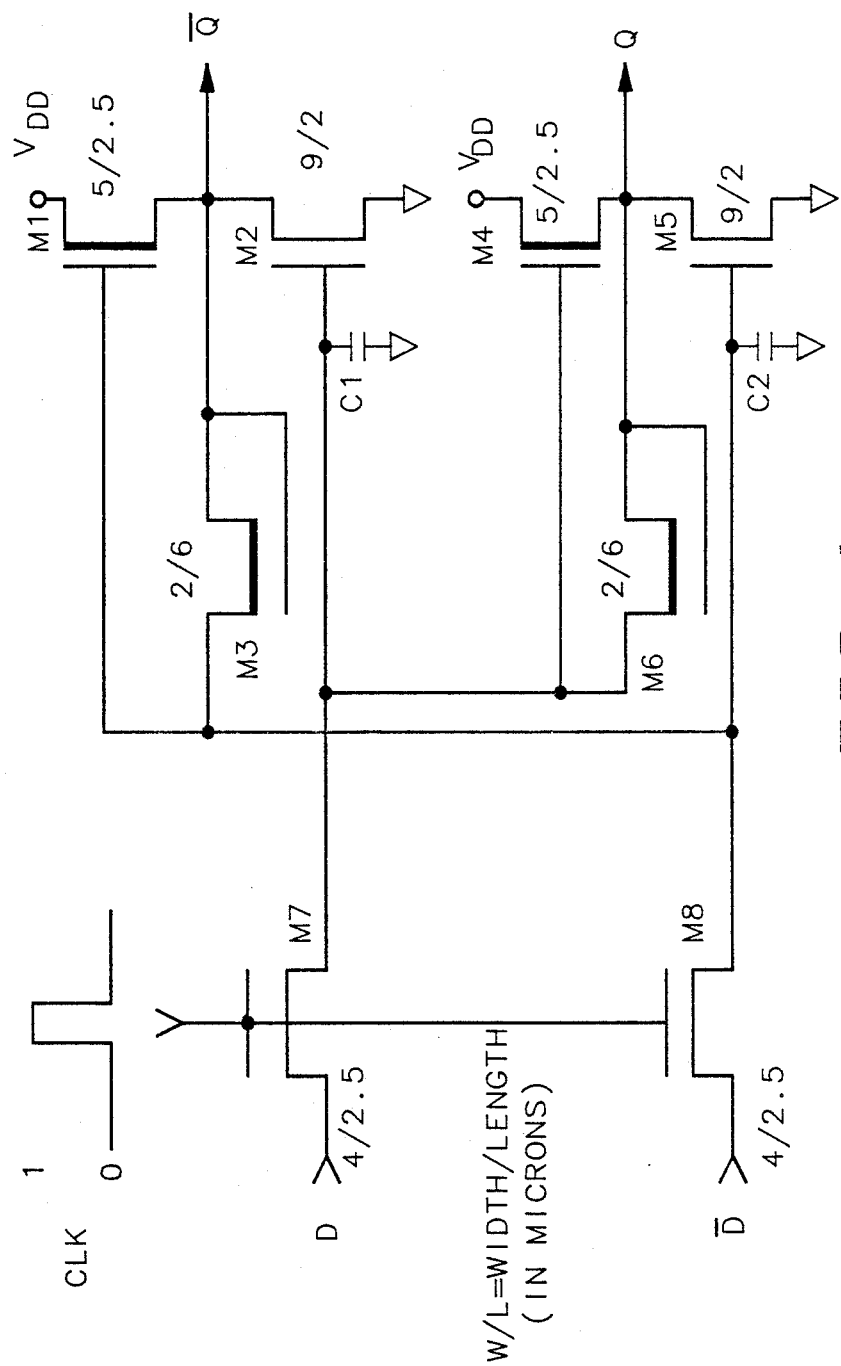
FIG. 1 depicts an embodiment of the invention.

Refer now to FIG. 1, wherein is shown a schematic representation of a static N-channel MOS latch constructed upon an integrated circuit in accordance with the invention. As shown there, a first stage includes a depletion device M1 in series with an enhancement device M2. (It will be understood, of course, that the term "device" refers to a metal oxide semiconductor field effect transistor, or MOS FET.) Assuming that the circuit is to be fabricated with an N-channel process, the drain of M1 is connected to $V_{DD}$, while the source of M2 is connected to ground. M1 serves as a load for M2. The junction of M1 and M2 is connected to two places. First, it serves as the NOT-Q output of the latch, and second it is the origin of static feedback provided to the second stage (comprised of M4 and M5, to be discussed shortly). That static feedback is provided by a depletion device M3, whose gate and one other terminal are connected to the aforementioned junction. (Since the terms "source" and "drain" are applied in accordance with the way the device is connected to surrounding circuitry rather than according to structural details within the device itself, that "other terminal" may be referred to as either a source or a drain, according to individual preference. In an N-channel embodiment it might best be called a drain, but a source in a P-channel embodiment.)

An identical second stage includes a depletion load M4 and an enhancement device M5, again in series between $V_{DD}$ and ground. The junction of the two devices M4 and M5 is both the Q output and the origin of static feedback to the first stage. This static feedback originates with the connection of the gate and one other terminal of a depletion device M6 to that junction.

Inputs D and Not-D are clocked into the latch through transfer gates M7 and M8, respectively, whenever a clock signal CLK is true. While the transfer gates are on, the inputs D and NOT-D charge (or discharge) capacitors C1 and C2. Those familiar with MOS integrated circuits will appreciate that capacitors C1 and C2 are not separate circuit components, but are instead simply "stray" capacitances found in the circuit; e.g., the gate capacitances of M1, M2, M4, and M5.

Within the latch the inputs are used in "super buffer" fashion. That is, the D input is applied to the gate of M2 and to the gate of M4. Likewise, the input Not-D is applied to the gate of M5 and to the gate of M1. This causes complementary operation of devices M1 and M2, and of M4 and M5.

As can be seen from an inspection of the figure, the remaining third terminal of device M3 is also coupled to the gate of M5, while the remaining third terminal of M6 is also coupled to the gate of M2. Devices, M3 and M6 are permanently biased on and function as replacements for resistors in the range of, say, fifty to two hundred and fifty kilo-ohms. Their purpose is as follows. Absent M3 and M6 the only things that determine the output of the latch are the charges on C1 and C2. These charges eventually decay, which is why dynamic latches require refreshing. Devices M3 and M6 provide enough current to offset the leakage currents for C1 and C2, thereby stabilizing the charge on those capacitors. For example, when the Q output is high, the charge on C1 is kept from decreasing by replacement current supplied through M6. M2 is thus kept on. Similarly, M3 also acts as a shunt to ground across C2 to prevent it from accumulating any stray charge that would tend to turn M5 on. The roles of M3 and M6 are reversed when the latch is in the other state.

It should be noted that it is desirable that the effective "on" resistances of devices M3 and M6 be no lower than that which is necessary to maintain the charges of C1 and C2, or failing that, at least as high as practical. The leakage currents for C1 and C2 are each in the pico- or sub-picoamp range. This implies that the effective on resistances of devices M3 and M6 could easily be as high as several tens or even several hundreds of meg-ohms, and yet still safely maintain the charges on C1 and C2. Unfortunately, it is at present impractical to fabricate devices small enough to have such high resistances when on. The best that can be done is to make them as narrow as possible, as long as space permits, and perhaps reduce their doping levels. In the particular process used for fabricating the instant devices M3 and M6, a width of two microns is the minimum dimension for either width or length. Accordingly, they were fabricated with a width of two microns, a length of six microns, and with a doping level of approximately seventy percent of that used for a normal depletion device. This resulted in devices having effective on resistances in the range of seventy-five to one hundred and fifty kilo-ohms.

Even though the resulting M3 and M6 do not have on resistances in the megohm range they nevertheless function quite satisfactorily. That is because their on resistance is considerably greater than that of transfers gates M7 and M8, thus preserving good isolation between the inputs D and NOT-D and their respective outputs NOT-Q and Q. This is important, as the following example will illustrate. Suppose the incoming value of D to be clocked through M7 to charge C1 is different than the existing value for Q. A low resistance in M6 would allow the Q output to load down the D input, increasing the drive and amount of time needed for the input to set up C1. This difficulty does not arise, because M6 (and M3, too) has a high effective resistance. This allows the shortest possible gate time through M7 and the best possible charging of C1. A change in the state of output Q is properly left to the effects of applying the D input to the gates of M2 and M4, while the NOT-D input is simultaneously applied to the gates of M1 and M5. The rule of thumb offered here is that the on resistance of M3 should be at least four times that of M8, and M6's four times that of M7. In this way the latch of FIG. 1 is made to operate at high speeds, consume low power, and yet be static.

Yet another reason for keeping the on resistances of M3 and M6 high is to prevent so-called "charge sharing" or "charge dumping". This occurs when the state of an input briefly loads down the output of the previous stage when the transfer gate connecting them is clocked on. The result is a glitch in that previous stage's output, and the possibility of a logic malfunction. Low impedances to adverse voltage levels in the input being driven are the cause of charge sharing, and in the present circuit this is not caused by the presence of an on M3 or M6 so long as their on resistances are modestly high.

Figure 2:
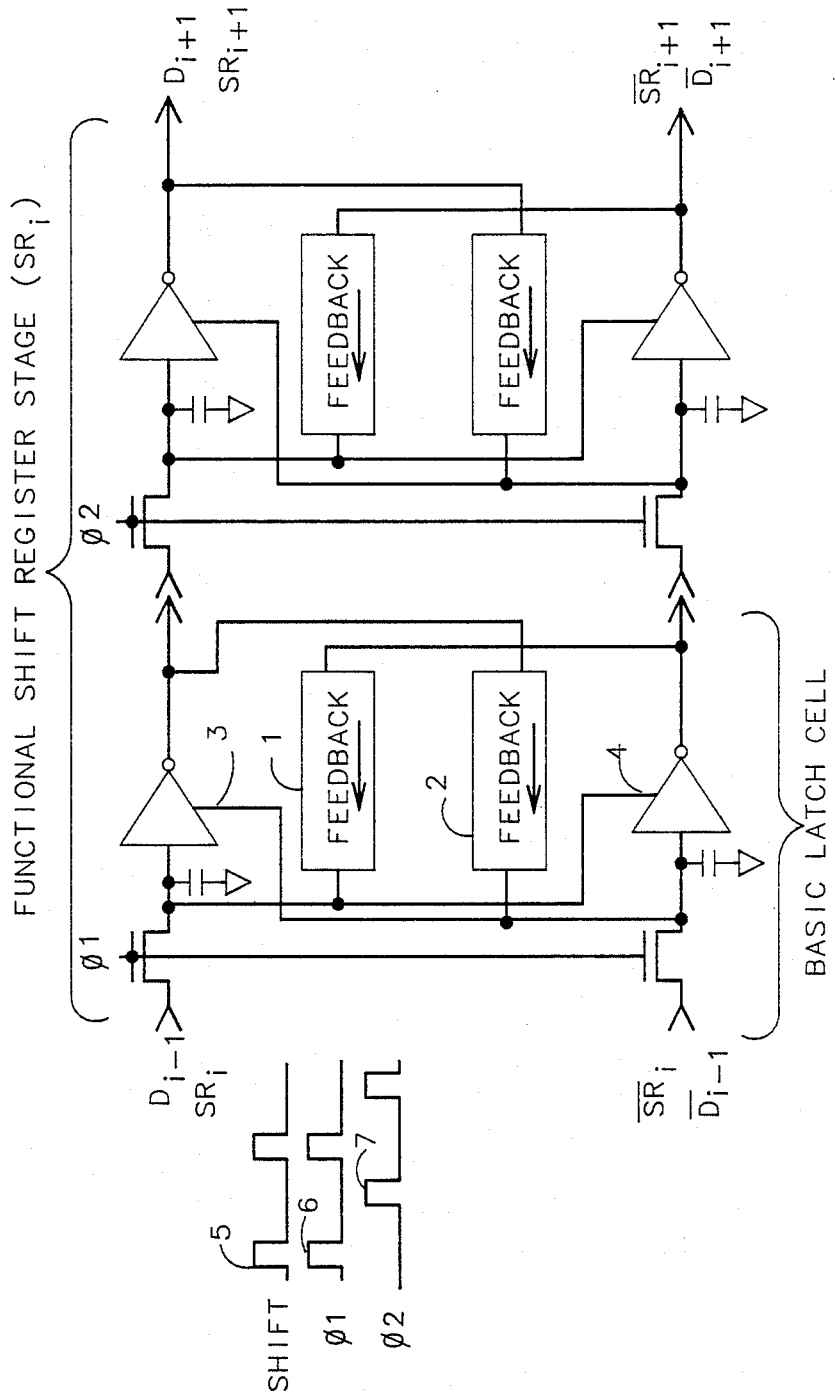
FIG. 2 depicts a portion of a static shift register circuit employing the invention.

We turn now to FIG. 2, wherein is shown a portion of an implementation of a static shift register circuit using the static latches of FIG. 1. Each of representative basic latch cells are identical to the latch of FIG. 1. In particular, feedback element 1 corresponds to M6 of FIG. 1, while feedback element 2 corresponds to M3. Similarly, line 3 represents the connection from the NOT-D input of FIG. 1 to the gate of M1. Line 4 represents the corresponding connection of the D input to the gate of M4.

A functional shift register stage is shown as two consecutive basic latch cells. A two step clocking process takes data from one cell to the next. Upon receipt of a shift signal 5 a circuit (not itself shown) produces an instance of a pair of non-overlapping clock signals 01 and 02. The signal 01 6 might simply be the shift signal 5. At any rate, it is abundantly clear from the figure that after each 01/02 pair the contents of the shift register is shifted one whole shift register stage to the right. The advantage of the circuit of FIG. 2 over the prior art dynamic shift registers is that the shifting can be performed at any rate up to the maximum. In particular, it can be done as slowly as desired, since each stage of the shift register is a static latch.

I claim:
1. A static MOS latch comprising:
   a first enhancement MOSFET having first, second and gate terminals;
   a first depletion MOSFET having first, second and gate terminals;
   a first electrical connection between the first terminal of the first enhancement MOSFET and the second terminal of the first depletion MOSFET;
   a second enhancement MOSFET having first, second and gate terminals;
   a second depletion MOSFET having first, second and gate terminals;
   a second electrical connection between the first terminal of the second enhancement MOSFET and the second terminal of the second depletion MOSFET;
   a third depletion MOSFET of which the gate and one other terminal are electrically connected to the first electrical connection, and of which a remaining terminal is electrically connected to the gate of the second enhancement MOSFET and to the gate of the first depletion MOSFET;
   a fourth depletion MOSFET of which the gate and one other terminal are electrically connected to the second electrical connection and of which a remaining terminal is electrically connected to the gate of the first enhancement MOSFET and to the gate of the second depletion MOSFET;
   wherein the gate terminals of the first and second enhancement MOSFET's are coupled to an input means for determining the state of the static MOS latch;
   wherein at least one of the first and second electrical connections is for supplying an output signal; and
   wherein the first terminals of the first and second depletion MOSFET's are each electically connected to a first supply terminal, the second terminals of the first and second enhancement MOSFET's are electrically connected to a second supply terminal; the first and second supply terminals for receiving a voltage to energize the static MOS latch.

2. A static MOS latch as in claim 1, wherein the input means further comprises:
   first input gating means electrically connected to the gate terminal of the first enhancement MOSFET and to the gate terminal of the second depletion MOSFET, for applying thereto in response to a clock signal an input signal whose value is indicative of a desired state of the state of the latch; and
   second input gating means electrically connected to the gate terminal of the second enhancement MOSFET and to the gate of the first depletion MOSFET, for applying thereto in response to the clock signal the complement of the input signal.

3. First and second static MOS latches as in claim 2 coupled to form a shift register stage wherein the first electrical connection of the first static latch MOS latch is coupled to the first input gating means of the second static MOS latch, the second electrical connection of the first static MOS latch is coupled to the second input gating means of the second static MOS latch, and wherein the clock signal for the first static MOS latch and the clock signal for the second static MOS latch are non-overlapping and complementary.

* * * * *